US007961477B2

(12) United States Patent
Deuringer et al.

(10) Patent No.: US 7,961,477 B2
(45) Date of Patent: Jun. 14, 2011

(54) HOUSING COMPRISING A LIQUID-TIGHT ELECTRIC BUSHING

(75) Inventors: Josef Deuringer, Herzogenaurach (DE); Richard Eichhorn, Hirschaid (DE); Lars Lauer, Nürnberg (DE); Gerd Mörsberger, Bubenreuth (DE); Paul Ponnath, Fürth (DE); Roland Rabe, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 622 days.

(21) Appl. No.: 10/588,556

(22) PCT Filed: Dec. 27, 2004

(86) PCT No.: PCT/EP2004/053712

§ 371 (c)(1),
(2), (4) Date: Aug. 4, 2006

(87) PCT Pub. No.: WO2005/081366

PCT Pub. Date: Sep. 1, 2005

(65) Prior Publication Data

US 2007/0201216 A1 Aug. 30, 2007

(30) Foreign Application Priority Data

Feb. 13, 2004 (DE) ........................ 10 2004 007 230

(51) Int. Cl.
*H05K 5/00* (2006.01)

(52) U.S. Cl. ........ 361/752; 361/689; 361/697; 361/749; 361/750; 174/262; 174/541; 174/539; 174/564; 378/130; 378/200; 29/830; 29/852; 438/91

(58) Field of Classification Search .................. 361/752, 361/679, 749–751, 697, 704, 689; 174/262, 174/541, 539, 564; 438/91; 29/830, 852; 378/130, 200
See application file for complete search history.

(56) References Cited

U.S. PATENT DOCUMENTS

| | | | | |
|---|---|---|---|---|
| 3,797,342 | A * | 3/1974 | Sekel | 83/55 |
| 3,879,836 | A * | 4/1975 | Coffin | 228/264 |
| 4,490,614 | A | 12/1984 | Peerenboom et al. | |
| 4,593,961 | A * | 6/1986 | Cosmo | 439/66 |
| 5,061,193 | A | 10/1991 | Seaman | |
| 5,793,150 | A | 8/1998 | Kober et al. | |
| 5,844,781 | A * | 12/1998 | Schlotterer et al. | 361/752 |
| 5,913,688 | A * | 6/1999 | Marian, Jr. | 439/76.1 |
| 5,987,996 | A * | 11/1999 | Kim et al. | 73/756 |
| 6,023,413 | A * | 2/2000 | Umezawa | 361/697 |
| 6,108,201 | A * | 8/2000 | Tilton et al. | 361/689 |
| 6,138,674 | A * | 10/2000 | Gull et al. | 128/204.21 |
| 6,180,880 | B1 | 1/2001 | Loibl et al. | |
| 6,183,290 | B1 * | 2/2001 | Loibl | 439/492 |
| 6,198,631 | B1 * | 3/2001 | Radosavljevic et al. | 361/704 |

(Continued)

FOREIGN PATENT DOCUMENTS

DE 33 15 655 AI 11/1983

(Continued)

*Primary Examiner* — Xiaoliang Chen
(74) *Attorney, Agent, or Firm* — Lempia Summerfield Katz LLC

(57) ABSTRACT

A housing comprising a liquid-tight electric bushing is provided. The housing comprises an opening and a printed circuit board comprising at least first and second layers. The first layer is a top side of the printed circuit board and spans the opening. A first contact element is disposed on the top side and in a blind bore through the first layer that extends to the second layer. The second layer is a conductor track in the interior of the printed circuit board.

14 Claims, 1 Drawing Sheet

U.S. PATENT DOCUMENTS

| | | | | | |
|---|---|---|---|---|---|
| 6,305,975 | B1 * | 10/2001 | Steiner | 439/559 |
| 6,316,768 | B1 * | 11/2001 | Rockwood et al. | 250/287 |
| 6,364,527 | B1 | 4/2002 | Kutschera | |
| 6,441,609 | B2 | 8/2002 | Loibl et al. | |
| 6,521,830 | B1 | 2/2003 | Platz | |
| 6,542,577 | B1 * | 4/2003 | Kaczmarek et al. | 378/130 |
| 6,614,108 | B1 * | 9/2003 | Sanftleben et al. | 257/710 |
| 6,640,645 | B2 * | 11/2003 | Groger | 73/753 |
| 6,737,579 | B1 | 5/2004 | Laufer et al. | |
| 6,892,781 | B2 * | 5/2005 | McHerron et al. | 156/580 |
| 6,931,723 | B1 * | 8/2005 | Powell | 29/852 |
| 7,063,511 | B2 * | 6/2006 | Urbank et al. | 417/222.2 |
| 7,092,031 | B1 * | 8/2006 | Wiedemann | 348/374 |
| 7,164,197 | B2 * | 1/2007 | Mao et al. | 257/700 |
| 2002/0009825 | A1 * | 1/2002 | Blalock et al. | 438/91 |
| 2002/0195271 | A1 | 12/2002 | Gailus | |

FOREIGN PATENT DOCUMENTS

| | | | |
|---|---|---|---|
| DE | 40 38 394 AI | | 6/1992 |
| DE | 44 23 893 | C2 | 9/1996 |
| DE | 197 34 032 | C1 | 12/1998 |
| DE | 198 00 928 AI | | 4/1999 |
| DE | 198 51 853 | C1 | 6/2000 |
| DE | 199 44 383 AI | | 4/2001 |
| DE | 100 51 945 | C1 | 11/2001 |
| EP | 0 375 271 | A2 | 6/1990 |
| EP | 1 182 740 | A2 | 2/2002 |
| WO | WO 99/26319 | | 5/1999 |
| WO | WO 00/11481 | | 3/2000 |

* cited by examiner

HOUSING COMPRISING A LIQUID-TIGHT ELECTRIC BUSHING

The present patent document is a continuation of PCT Application Ser. No. PCT/EP2004/053712, filed Dec. 27, 2004, designating the United States, which is hereby incorporated by reference.

BACKGROUND

1. Field

The present embodiments relate to a housing having a liquid-tight electric bushing.

2. Related Art

In X-ray emitters, an X-ray tube is received in a housing. During the operation of the X-ray tube, coolant oil is circulated through the housing at an over pressure to cool the X-ray tube. Electric lines for triggering and monitoring the X-ray tube are guided through the housing wall by a closure that closes an opening in the housing. Coolant oil flows to the outside of the housing via contact pins that are disposed in the closure and emerges in an unwanted way on the outside of the housing. Conventional closures involve relatively great effort to produce, and thus are expensive. There is a need for a housing with improved tightness and a simplistic design.

SUMMARY

The present embodiments are directed to a housing comprising a liquid-tight electric bushing, which may obviate one or more of the problems due to the limitations and disadvantages of the related art.

A housing having a liquid-tight electric bushing comprises an opening and a printed circuit board. The printed circuit board (pcb) is a closure that comprises at least first and second layers. The first layer points toward a housing interior and forms a top side of the printed circuit board, which spans the opening. The printed circuit board prevents the flowing of a liquid received in the housing to the outside of the housing and provides a closure with improved tightness.

A first contact element is provided on the top side. The first contact element is coupled to at least one electric line received in the housing. The first layer is produced from an electrical insulation material. Thus, the closure is electrically insulated from the housing.

The first contact element is disposed through a blind bore in the first layer and extends to at least the second layer. The bore contributes to preventing liquid received in the housing from flowing transversely through the layers of the printed circuit board.

In another embodiment, the first contact element is connected to a second contact element via a conductor track, which is guided in the interior of the printed circuit board and forms a second layer.

The second contact element is disposed on an underside that is opposite the top side and extends outside an edge of the printed circuit board.

In another embodiment, the printed circuit board is flexible. Thus, simple adaptation is possible, for example, to geometries of the opening that are not planar.

The printed circuit board has a plurality of second layers of conductor tracks disposed one above the other. In this case, the first contact element and the second contact element may be connected via a plurality of conductor tracks, which are disposed one above the other and are electrically coupled to each other. In this embodiment, the housing is liquid tight under extreme loads.

In another embodiment, a seal is provided between the printed circuit board and the housing. Moreover, a pressure plate contacts the underside of the printed circuit board and presses the printed circuit board against the seal, which can simplify assembly. Because the printed circuit board is mechanically stabilized, the housing is protected against, for example, an over pressure present in the housing.

The present embodiments are suitable for many types of housings that are filled with a liquid, for example, motor housings and gearboxes, reactors that perform chemical reactions, and the housings of heating and cooling systems. The proposed electric bushing is also suitable an X-ray device. In this case, an X-ray tube is disposed in the housing.

In accordance with the preferred embodiments, a method of using a printed circuit board as a closure for liquid-tight closing of an opening, which is provided in housing, and as an electric bushing is provided.

With regard to the advantageous embodiment of the method, the aforementioned characteristics can logically form embodiments of the method.

BRIEF DESCRIPTION OF THE DRAWINGS

Further advantages, characteristics and details will become apparent from the ensuing exemplary embodiments and from the drawings. In the drawings.

DETAILED DESCRIPTION OF THE PRESENTLY PREFERRED EMBODIMENTS

Figure 1:
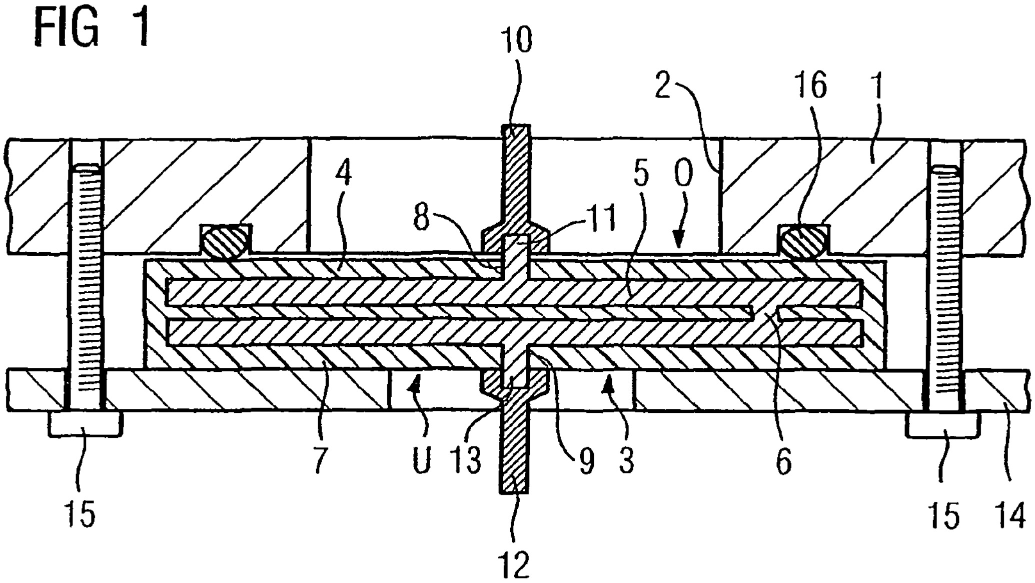
FIG. 1 is a sectional view of a first exemplary embodiment.

In the first exemplary embodiment shown in FIG. 1, a housing 1 has an opening 2. A printed circuit board 3 has a first layer 4, made from an electrical insulation material, which points toward the interior of the housing 1 and spans the opening 2. The first layer 4 forms a top side O of the printed circuit board 3. In the interior of the printed circuit board 3, a plurality of electrically conductive second layers 5 are provided in an arrangement one above the other. The second layers 5 are electrically coupled to one another via a bridge 6. For example, the second layers 5 are conductor tracks. An underside U of the printed circuit board 3, which is opposite the top side O, is formed of a third layer 7 that is made from an electrical insulation material. A first blind bore 8 is provided in the first layer 4, and a second blind bore 9 is provided in the third layer 7. A first contact element 10 is mounted on the top side O and connects electrically to the second layer 5 by a first connection 11 that is guided by the first bore 8. A second electrical contact element 12 provided on the underside U is also connected electrically to the second layer 5 by a second connection 13 guided by the second blind bore 9. The first contact element 10 and the second contact element 12 are preferably mounted by SMD (surface mounted device) technology on the printed circuit board 3.

As shown in FIG. 1, a pressure plate 14 is mounted on the housing 1 by a screw or screws 15. The pressure plate 14 rests on the underside U of the printed circuit board 3 and presses the topside O against an O-ring seal 16. In this embodiment, the pressure plate 14 spans a substantial portion of the opening 2 and thus stabilizes the printed circuit board 3 against liquid over pressure present in the housing 1.

Figure 2:
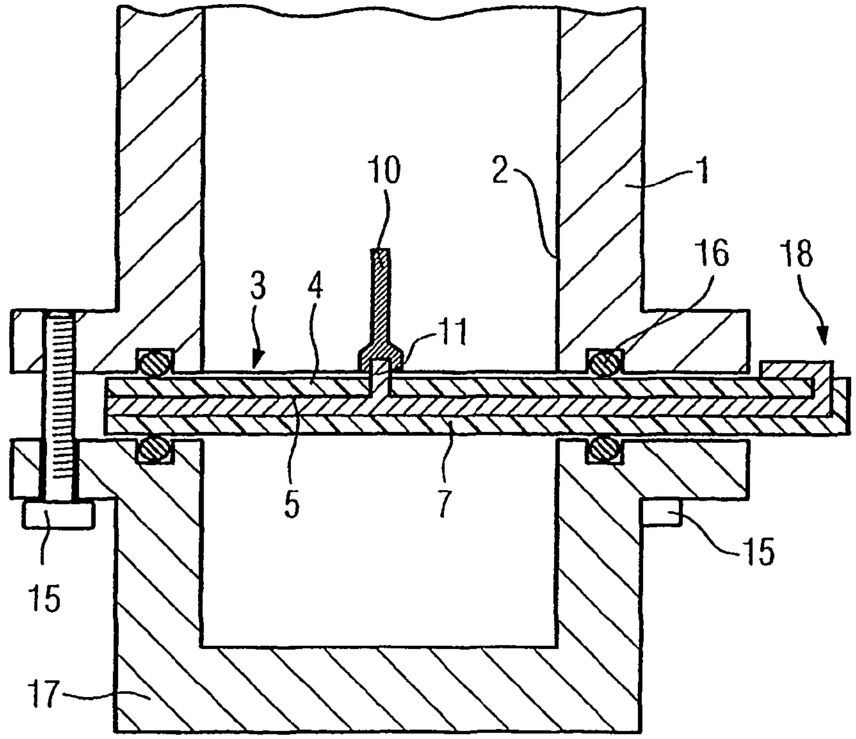
FIG. 2 is a sectional view of a second exemplary embodiment.

In the exemplary embodiment shown in FIG. 2, the printed circuit board 3 is retained on the housing 1 by a cap 17. In this embodiment, a portion of the printed circuit board 3 protrudes laterally out of the housing 1. The second layer 5 has a bent-over portion 18 on the edge that extends out of the housing 1. In this embodiment, it possible to produce an electrical connection with the second layer 5 by, for example, snapping a suitable flat plug onto the portion of the printed circuit board 3 that protrudes laterally from the housing 1.

As can be seen from FIGS. 1 and 2, the opening 2 is spanned by the first layer 4 of the printed circuit board 3. In the first layer 4, a first blind bore 8 is provided that extends at least to the second layer 5. Because the printed circuit board 3 has no continuous opening, flowing of coolant oil into a continuous opening of the kind used in the prior art is prevented.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A housing having a liquid-tight electric bushing, the housing comprising:

an opening in the housing of an X-ray tube, wherein a coolant oil is circulated through the housing at an overpressure to cool the X-ray tube during operation thereof;

a printed circuit board mounted to the housing and having at least first and second layers, the at least first and second layers being configured without a continuous opening such that the printed circuit board is a liquid-tight closure that prevents the coolant oil from flowing outside of the housing, the first layer being produced from an electrical insulation material and being a top side of the printed circuit board that spans the opening and the second layer being a conductor track in the interior of the printed circuit board, wherein a first contact element is disposed on the top side and in a bore through the first layer that extends to at least the second layer;

a seal disposed around the opening in the housing and between the printed circuit board and the housing; and a pressure plate that contacts an underside of the printed circuit board and is mounted on the housing such that the pressure plate presses the first layer of the printed circuit board against the seal around the opening in the housing such that the first layer of the printed circuit board forms the liquid tight closure that prevents the coolant oil from flowing out the opening in the housing.

2. The housing as defined by claim 1, wherein the first contact element is coupled to a second contact element via the second layer.

3. The housing as defined by claim 2, wherein the second contact element is on the underside that is opposite the top side.

4. The housing as defined by claim 2, wherein the second contact element extends to an outside edge of the printed circuit board.

5. The housing as defined by claim 1, wherein the printed circuit board is flexible.

6. The housing as defined by claim 1, wherein the printed circuit board comprises a plurality of second layers, located one above the other.

7. The housing as defined by claim 2, wherein the first contact element and the second contact element are coupled via a plurality of conductor tracks, which are located one above the other and are electrically coupled.

8. A method of using a printed circuit board to close an opening provided in a housing and as an electric bushing, the method comprising:

disposing a seal around the opening in the housing and between the printed circuit board and the housing, disposing a pressure plate that contacts an underside of the printed circuit board to press the printed circuit board against the seal around the opening in the housing, mounting the printed circuit board comprising a first layer on the housing of an X-ray tube, wherein a coolant oil is circulated through the housing at an overpressure to cool the X-ray tube during operation thereof, the printed circuit board having no continuous opening such that the printed circuit board is a liquid-tight closure that prevents the coolant oil from flowing to the outside of the housing, wherein the first layer spans the opening, is the top side of the printed circuit board and is produced from an electrical insulation material, and disposing a first contact element on the top side and through a bore in the top side, wherein the bore extends to at least a second layer formed in the printed circuit board, the second layer being a conductor track, wherein mounting the printed circuit board comprises mounting the pressure plate on the housing such that the pressure plate presses the first layer of the printed circuit board against the seal around the opening such that the first layer of the printed circuit board forms the liquid-tight closure that prevents the coolant oil from flowing out of the opening in the housing.

9. The method as defined by claim 8, wherein the method further comprises connecting the first contact element to a second contact element via the second layer.

10. The method as defined by claim 9, wherein the method further comprises disposing the second contact element on the underside that is opposite the top side.

11. The method as defined by claim 9, wherein the method further comprises extending the second contact element to an outside edge of the printed circuit board.

12. The method as defined by claim 8, wherein the method further comprises using the printed circuit board that is flexible.

13. The method as defined by claim 8, wherein the method comprises using the printed circuit board that has a plurality of second layers located one above the other.

14. The method as defined by claim 13, wherein the first contact element and a second contact element are connected via a plurality of conductor tracks in alignment with each other.

* * * * *